(12) United States Patent
Albers et al.

(10) Patent No.: US 10,153,740 B2
(45) Date of Patent: Dec. 11, 2018

(54) SPLIT SIGNAL DIFFERENTIAL MEMS MICROPHONE

(71) Applicant: Knowles Electronics, LLC, Itasca, IL (US)

(72) Inventors: John J. Albers, Chicago, IL (US); Thomas Froehlich, Premstaetten (AT)

(73) Assignees: Knowles Electronics, LLC, Itasca, IL (US); AMS AG, Premstaetten (AT)

( * ) Notice: Subject to any disclaimer, the term of this patent is extended or adjusted under 35 U.S.C. 154(b) by 1 day.

(21) Appl. No.: 15/207,116

(22) Filed: Jul. 11, 2016

(65) Prior Publication Data

US 2018/0012588 A1 Jan. 11, 2018

(51) Int. Cl.
*H04R 3/00* (2006.01)
*H03F 3/187* (2006.01)
*G10K 11/178* (2006.01)
*H02M 3/07* (2006.01)
*H03F 1/56* (2006.01)
(Continued)

(52) U.S. Cl.
CPC .......... *H03F 3/187* (2013.01); *G10K 11/178* (2013.01); *H02M 3/07* (2013.01); *H03F 1/56* (2013.01); *H03F 3/45475* (2013.01); *H04R 3/04* (2013.01); *H04R 19/005* (2013.01); *H04R 19/04* (2013.01); *H04R 3/00* (2013.01); *H04R 19/016* (2013.01); *H04R 2201/003* (2013.01); *H04R 2499/11* (2013.01)

(58) Field of Classification Search
CPC . H04R 3/04; H04R 19/04; H04R 3/00; H04R 2201/003; H04R 2499/11; H04R 19/016; H04R 19/005; H03F 3/187; H03F 1/56; H03F 3/45475; G10K 11/178; H02M 3/07

USPC ................................................ 381/71.7, 111
See application file for complete search history.

(56) References Cited

U.S. PATENT DOCUMENTS 3,445,596 A   6/1969   Francis et al.
7,190,038 B2  3/2007   Dehe et al.
(Continued)

FOREIGN PATENT DOCUMENTS

WO   WO 1994/23547 A1   10/1994

OTHER PUBLICATIONS

International Search Report and Written Opinion, PCT/US2017/041542, Knowles Electronics, LLC, 14 pages (dated Oct. 2, 2017).

*Primary Examiner* — Paul S Kim
*Assistant Examiner* — Ubachukwu Odunukwe
(74) *Attorney, Agent, or Firm* — Foley & Lardner LLP

(57) ABSTRACT

A microphone assembly includes a capacitive MEMS transducer and a bias circuit having a DC output coupled to the transducer. The microphone assembly also includes a differential amplifier having a first input coupled to a first output of the transducer, the differential amplifier having a second input coupled to a second output of the transducer. The microphone assembly further includes a first impedance matching network and a second impedance matching network configured to balance a first capacitive load at the first input of the amplifier and a second capacitive load at the second input of the amplifier. Electrical signals applied by the transducer to the first and second inputs of the amplifier are matched or approximately matched in magnitude and 180 degrees or approximately 180 degrees out of phase with respect to each other.

18 Claims, 7 Drawing Sheets

(51) Int. Cl.
  *H03F 3/45*    (2006.01)
  *H04R 3/04*    (2006.01)
  *H04R 19/04*   (2006.01)
  *H04R 19/00*   (2006.01)
  *H04R 19/01*   (2006.01)

(56) References Cited

U.S. PATENT DOCUMENTS

| | | | |
|---|---|---|---|
| 7,473,572 | B2 | 1/2009 | Dehe et al. |
| 7,781,249 | B2 | 8/2010 | Laming et al. |
| 7,795,695 | B2 | 9/2010 | Weigold et al. |
| 7,825,484 | B2 | 11/2010 | Martin et al. |
| 7,829,961 | B2 | 11/2010 | Hsiao |
| 7,856,804 | B2 | 12/2010 | Laming et al. |
| 7,903,831 | B2 | 3/2011 | Song |
| 8,139,790 | B2 * | 3/2012 | Wu .............. H04R 3/00 381/111 |
| 2005/0207605 | A1 | 9/2005 | Dehe et al. |
| 2007/0278501 | A1 | 12/2007 | MacPherson et al. |
| 2008/0175425 | A1 | 7/2008 | Roberts et al. |
| 2008/0267431 | A1 | 10/2008 | Leidl et al. |
| 2008/0279407 | A1 | 11/2008 | Pahl |
| 2008/0283942 | A1 | 11/2008 | Huang et al. |
| 2009/0001553 | A1 | 1/2009 | Pahl et al. |
| 2009/0180655 | A1 | 7/2009 | Tien et al. |
| 2010/0046780 | A1 | 2/2010 | Song |
| 2010/0052082 | A1 | 3/2010 | Lee et al. |
| 2010/0128914 | A1 | 5/2010 | Khenkin |
| 2010/0183181 | A1 | 7/2010 | Wang |
| 2010/0246877 | A1 | 9/2010 | Wang et al. |
| 2010/0290644 | A1 | 11/2010 | Wu et al. |
| 2010/0322443 | A1 | 12/2010 | Wu et al. |
| 2010/0322451 | A1 | 12/2010 | Wu et al. |
| 2011/0013787 | A1 | 1/2011 | Chang |
| 2011/0026739 | A1 * | 2/2011 | Thomsen .............. H03F 1/3211 381/120 |
| 2011/0075875 | A1 | 3/2011 | Wu et al. |
| 2011/0117860 | A1 * | 5/2011 | Kimball .................. H03F 1/565 455/73 |
| 2013/0015919 | A1 | 1/2013 | Kropfitsch et al. |
| 2013/0136267 | A1 * | 5/2013 | Hammerschmidt ..... H04R 3/06 381/58 |
| 2015/0023529 | A1 * | 1/2015 | Barzen .............. G01R 27/2605 381/174 |
| 2015/0125003 | A1 | 5/2015 | Wiesbauer |
| 2016/0173992 | A1 | 6/2016 | Nicollini et al. |

* cited by examiner

SPLIT SIGNAL DIFFERENTIAL MEMS MICROPHONE

BACKGROUND

The following description is provided to assist the understanding of the reader. None of the information provided or references cited is admitted to be prior art.

Different types of acoustic devices have been used through the years. One type of device is a microphone. In a microelectromechanical system (MEMS) microphone, a MEMS die includes at least one diaphragm and at least one back plate. The MEMS die is supported by a substrate and enclosed by a housing (e.g., a cup or cover with walls). A port may extend through the substrate (for a bottom port device) or through the top of the housing (for a top port device). In any case, sound energy traverses through the port, moves the diaphragm and creates a changing potential of the back plate, which creates an electrical signal. Microphones are deployed in various types of devices such as personal computers or cellular phones.

Differential signals are often desired by users. In one example, a first transducer obtains a first differential signal and a second transducer obtains a second differential signal. The second signal is 180 degrees (or approximately 180 degrees) out of phase from the first signal and of the same magnitude. The signals are subtracted from each other to produce an output signal. The subtraction operation removes noise and other undesirable effects from the individual signals and can produce a larger and stronger output signal. However, these approaches at obtaining differential signals require the use of two transducers, which can be expensive and increase the size of the overall device. The problems of previous approaches have resulted in some user dissatisfaction with these previous approaches.

SUMMARY

In general, one aspect of the subject matter described in this specification can be embodied in an integrated circuit. The integrated circuit includes a first amplifier, a second amplifier, a first impedance matching network, a second impedance matching network, a first capacitive load, and a second capacitive load. The first impedance matching network is coupled to the first amplifier, a first charge pump, and a single MEMS transducer. The second impedance matching network is coupled to the second amplifier, a second charge pump, and the single MEMS transducer. The first capacitive load is measured at an input of first amplifier. The second capacitive load is measured at an input of the second amplifier. The first capacitive load and the second capacitive load are sized to equalize total capacitance including parasitic capacitances of an interconnect and the single MEMS transducer. According to an exemplary embodiment, a single pressure change causes the single MEMS transducer to create a first electrical signal and a second electrical signal. Each of the first electrical signal and the second electrical signal are matched or approximately matched in magnitude, and 180 degrees or approximately 180 degrees out of phase with respect to each other. Signals that are approximately 180 degrees out of phase and/or approximately matched in magnitude can be used when the two signals can be combined to create an output signal that reduces noise or other undesirable effects from the individual signals.

In general, another aspect of the subject matter described in this specification can be embodied in a microelectromechanical system (MEMS) microphone. The MEMS microphone includes a single MEMS transducer and an integrated circuit. The integrated circuit includes a first amplifier, a second amplifier, a first impedance matching network, a second impedance matching network, a first capacitive load, and a second capacitive load. The first impedance matching network is coupled to the first amplifier, a first charge pump, and a single MEMS transducer. The second impedance matching network is coupled to the second amplifier, a second charge pump, and the single MEMS transducer. The first capacitive load is measured at an input of first amplifier. The second capacitive load is measured at an input of the second amplifier. The first capacitive load and the second capacitive load are sized such that output signals of the first amplifier and the second amplifier have a similar amplitude but phase shifted by approximately 180 degrees. According to an exemplary embodiment, a single pressure change causes the single MEMS transducer to create a first electrical signal and a second electrical signal. Each of the first electrical signal and the second electrical signal are matched or approximately matched in magnitude, and 180 degrees or approximately 180 degrees out of phase with respect to each other.

In general, one aspect of the subject matter described in this specification can be embodied in an integrated circuit. The integrated circuit includes a first charge pump, a second charge pump, a first impedance matching network, a second impedance matching network, a first amplifier, and a second amplifier. The first charge pump is configured to couple to a single microelectromechanical system (MEMS) transducer. The first charge pump is configured to facilitate converting acoustic energy received by the single MEMS transducer into a first current signal. The second charge pump is configured to couple to the single MEMS transducer. The second charge pump is configured to facilitate converting the acoustic energy received by the single MEMS transducer into a second current signal. The first impedance matching network is coupled to the first charge pump. The first impedance matching network is configured to convert the first current signal into a first voltage signal. The second impedance matching network is coupled to the second charge pump. The second impedance matching network is configured to convert the second current signal into a second voltage signal. The first amplifier is coupled to the first impedance matching network. The first amplifier is configured to produce a first output voltage signal. The second amplifier is coupled to the second impedance matching network. The second amplifier configured to produce a second output voltage signal. According to an exemplary embodiment, the first output voltage signal and the second output voltage signal are differential signals that are (i) equal or approximately equal in magnitude and (ii) 180 degrees or approximately 180 degrees out of phase with respect to each other.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figure 1:
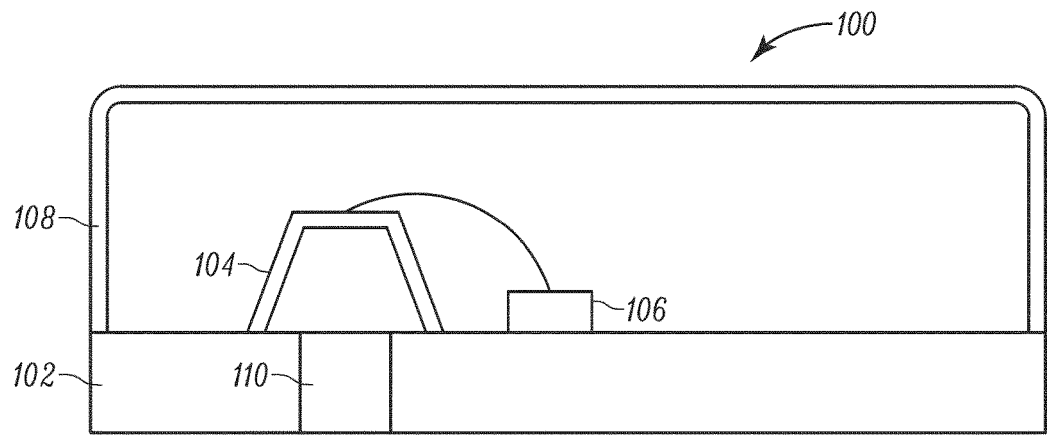
FIG. 1 is a side cutaway view of a MEMS microphone in accordance with various implementations.
Figure 2:
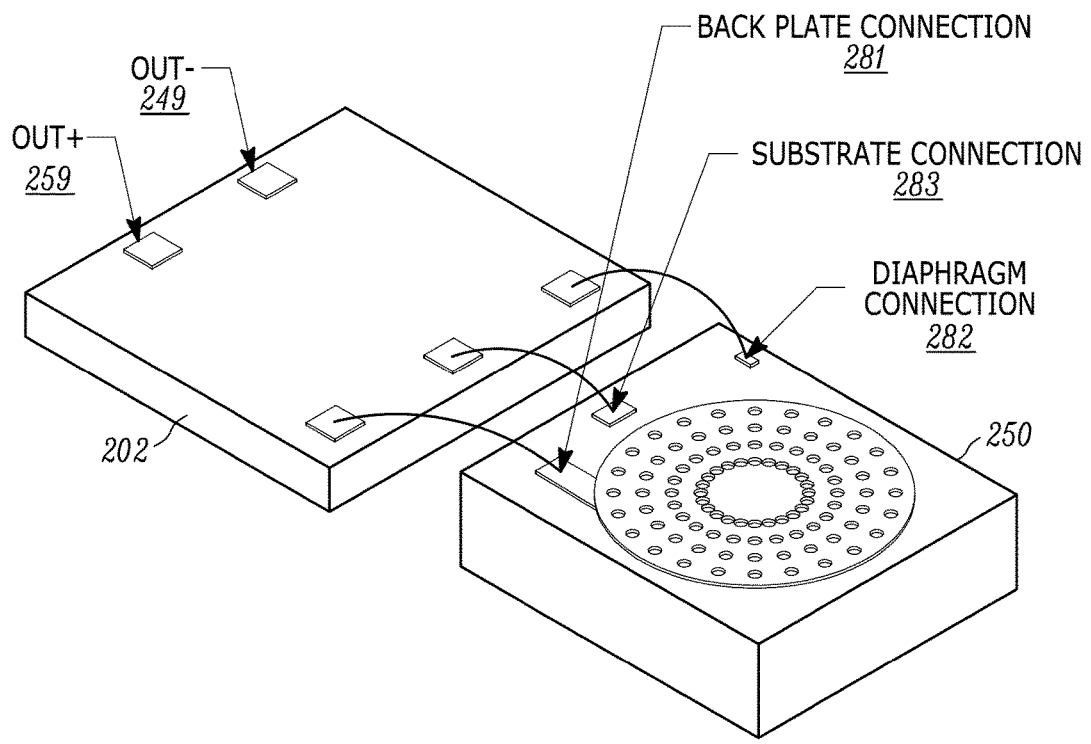
FIG. 2 is a perspective view of a MEMS microphone and an ASIC in accordance with various implementations.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

According to an exemplary embodiment, a MEMS microphone of the present disclosure creates a differential signal using a single MEMS transducer. The systems and apparatuses provided herein allow any MEMS microphone, MEMS accelerometer, and/or MEMS sensor (e.g., pressure or temperature to mention two examples) to be configured as and operated as a differential device (producing differential signals that can be subtracted from each other). Moreover, the integrated circuits used to implement these approaches are easy and straight forward to implement and produce. No additional assembly work is required. Additionally, since only one MEMS transducer is utilized, costs for the systems and/or apparatuses are decreased while space savings are achieved.

In some examples, an integrated circuit includes a first amplifier and a second amplifier. A first impedance matching network is coupled to the first amplifier, a first charge pump, and a single MEMS transducer. A second impedance matching network is coupled to the second amplifier, a second charge pump, and to the single MEMS transducer. A first capacitive load as measured at an input of first amplifier, and a second capacitive load as measured at an input of the second amplifier exist. The first capacitive load and the second capacitive load are sized to equalize total capacitance including parasitic capacitances of an interconnect and the MEMS transducer. A single change in an air gap (between a diaphragm and a back plate) of the capacitive transducer (for example, from a pressure change in the case of a microphone) causes the single MEMS transducer to create a first differential electrical signal and a second differential electrical signal. Both the first electrical signal and the second electrical signal are matched or approximately matched in magnitude, and 180 degrees or approximately 180 degrees out of phase with respect to each other.

According to an exemplary embodiment, the single MEMS transducer is configured to create differential signals at either side of the single transducer (i.e., one side being the back plate connection of the transducer and the other side being the diaphragm connection of the transducer). It will be appreciated that multiple transducers are not needed to create the differential signals. The differential signals produced may be utilized by other electronic devices, such as customer electronic devices in cellular phones, tablets, laptops, personal computers, smartwatches, and/or other devices.

In some embodiments, an electrical bias (supplied by the one or more charge pumps) is applied across the MEMS transducer. In some embodiments, the first charge pump and the second charge pump are a single pump. In other embodiments, the first charge pump and the second charge pump are different pumps. In still other embodiments, one of the first charge pump and the second charge pump is not included. In some embodiments, the first charge pump and/or the second charge pump are disposed at the integrated circuit. In other embodiments, the first charge pump and/or the second charge pump are disposed at a second integrated circuit.

In some embodiments, the first capacitive load is measured between a first input of the first amplifier and an alternating current (AC) ground. In some embodiments, the second capacitive load is measured between a second input of the second amplifier and an AC ground. Other measurement points may additionally or alternatively be used.

Referring now to FIG. 1, a MEMS microphone 100 is shown according to an exemplary embodiment. As shown in FIG. 1, the MEMS microphone 100 includes a substrate, shown as base 102 (e.g., a printed circuit board (PCB)), a MEMS device or die, shown as MEMS transducer 104 (e.g., including a diaphragm, a back plate, etc.), a circuit, shown as integrated circuit 106 (e.g., an application specific integrated circuit (ASIC)), and a lid, shown as cover 108, that encloses integrated circuit 106 and transducer 104. The MEMS devices, dies, or transducers described herein are single devices. That is, they utilize and are configured with a single MEMS motor (e.g., a single back plate matching a single diaphragm and disposed on a base or substrate).

As shown in FIG. 1, a bore, shown as port 110, extends through the base 102 (e.g., making this a bottom port microphone). In other embodiments, the port 110 is otherwise positioned (e.g., extends through the cover 108 making the MEMS microphone 100 a top port microphone).

In one embodiment, the integrated circuit 106 is an application specific integrated circuit (ASIC) and includes a first amplifier, a second amplifier, and/or a first impedance matching circuit. The first impedance matching circuit may be coupled to an input of the first amplifier, a first charge pump, and a first input to the MEMS transducer 104. A second impedance matching circuit may be coupled to an input of the second amplifier, a second charge pump, and/or a second input to the MEMS transducer 104.

A first capacitive load (e.g., measured at the input of the first amplifier) and a second capacitive load (e.g., measured at the input of the second amplifier) exist. The first capacitive load and the second capacitive load are balanced with respect to each other. By "balanced" it is meant, the sum of all loads (parasitic and intentional) are equal to each other. By "parasitic," it is meant an unavoidable capacitance due to two components being in close proximity to each other. By "intentional" it is meant a capacitance that is present by design and is intended to be present (e.g., a discrete capacitor). The parasitic load is a function of the intrinsic characteristics of the device, while the intentional load is the result of components (and the values of these components) as selected by a user.

In operation, sound pressure causes a change in voltage at the MEMS transducer 104, creating a first current flow at the first transducer input, and a second current flow at the second transducer input. The first current flow is opposite in direction to the second current flow. The first current flow is converted to a first differential voltage at the input of the first amplifier by the first impedance matching circuit, and the second current flow is converted to a second differential voltage at the input of the second differential amplifier by the second impedance matching circuit.

In some embodiments, the first amplifier amplifies the first differential voltage to create a first amplified differential voltage at the output of the first amplifier. The second amplifier amplifies the second differential voltage to create a second amplified differential voltage at the output of the second amplifier. The first amplified differential voltage and the second amplified differential voltage may be subtracted or added by a third amplifier. Each of the first amplified differential voltage and the second amplified differential voltage may be matched or approximately matched in magnitude, and 180 degrees or approximately 180 degrees out of phase with respect to each other. As a result, differential signals are produced that may be utilized by other electronic devices.

Referring now to FIGS. 2-5, circuit diagrams of the MEMS transducer 104 and the integrated circuit 106 are shown according to various exemplary embodiments. As shown in FIGS. 2, 3A, 4, and 5, an application specific integrated circuit (ASIC) 202 (i.e., the integrated circuit 106) couples to a MEMS transducer 250 (i.e., the MEMS transducer 104) at Vbias+, Vbias−, and substrate electrical connections. The ASIC 202 includes a first charge pump 204 (e.g., a positive charge pump), a second charge pump 206 (e.g., a negative charge pump) a first amplifier element 208, and a second amplifier element 210. The first charge pump 204 and the second charge pump 206 create an electrical bias that is applied across the MEMS transducer 250. In this example, two charge pumps are used to create the bias. In other examples, a single charge pump may be used. The bias allows the MEMS transducer 250 to convert received pressure (e.g., sound pressure, acoustic energy) into an electrical signal.

The first charge pump 204 includes a first voltage source 220, a first capacitor 222, and a first impedance element 224. The second charge pump 206 includes a second voltage source 230, a second capacitor 232, and a second impedance element 234. The ASIC 202 and the MEMS transducer 250 are connected at a first connection, shown as back plate connection 281, and a second connection, shown as diaphragm connection 282. A connection to a substrate is made via a third connection, shown as substrate connection 283.

The first amplifier element 208 includes a first impedance element 231, a first amplifier 233, and a first impedance matching circuit including a first capacitor 235, a second capacitor 236, and a third capacitor 238 (or other form of impedance matching). The first amplifier element 208 additionally includes a second impedance element 237 (e.g., a biasing resistor) configured as a DC bias path for the first amplifier element 208. Other implementations of DC biasing paths are also possible as long as the impedance of the DC biasing path is high ohmic enough to not degrade the noise performance or frequency response.

The second amplifier element 210 includes a second impedance element 241, a second amplifier 243, and a second impedance matching circuit including a first capacitor 245, a second capacitor 246, and a third capacitor 248 (or other form of impedance matching). The first capacitor 235 of the first amplifier element 208 and the first capacitor 245 of the second amplifier element 210 (e.g., decoupling capacitors) are configured to separate the common mode input voltage from the MEMS bias voltage generated by the first charge pump 204 and the second charge pump 206. In addition, the second amplifier element 210 includes a second impedance element 247 (e.g., a biasing resistor) configured as a DC bias path for the second amplifier element 210. Other implementations of DC biasing paths are also possible as long as the impedance of the DC biasing path is high ohmic enough to not degrade the noise performance or frequency response.

The MEMS transducer 250 is represented by a variable capacitor 252, a parasitic capacitance 254 associated with a back plate, and a parasitic capacitance 256 associated with a diaphragm. The exact values and configurations of the components shown in the drawings can vary, but in general a very high impedance (>1T ohm) is required at the inputs of the amplifiers. Values for intentional capacitors of the first amplifier element 208 (e.g., the second capacitor 236 and the third capacitor 238) and the second amplifier element 210 (e.g., the second capacitor 246 and the third capacitor 248) inside the ASIC 202 may be configured to match the capacitive load such that they are capable of balancing the parasitic capacitances from the MEMS transducer 250. In some embodiments, the first amplifier element 208 and/or the second amplifier element 210 do not include all of the capacitors. For example, some of the capacitors may be omitted depending on the parasitic capacitances already present. The MEMS transducer 250 may be configured such that the parasitic capacitances associated with this device are minimized. In some embodiments, the third capacitor 238 of the first amplifier element 208 and/or the third capacitor 248 of the second amplifier element 210 may additionally or alternatively be implemented on the MEMS transducer 250.

Figure 3A:
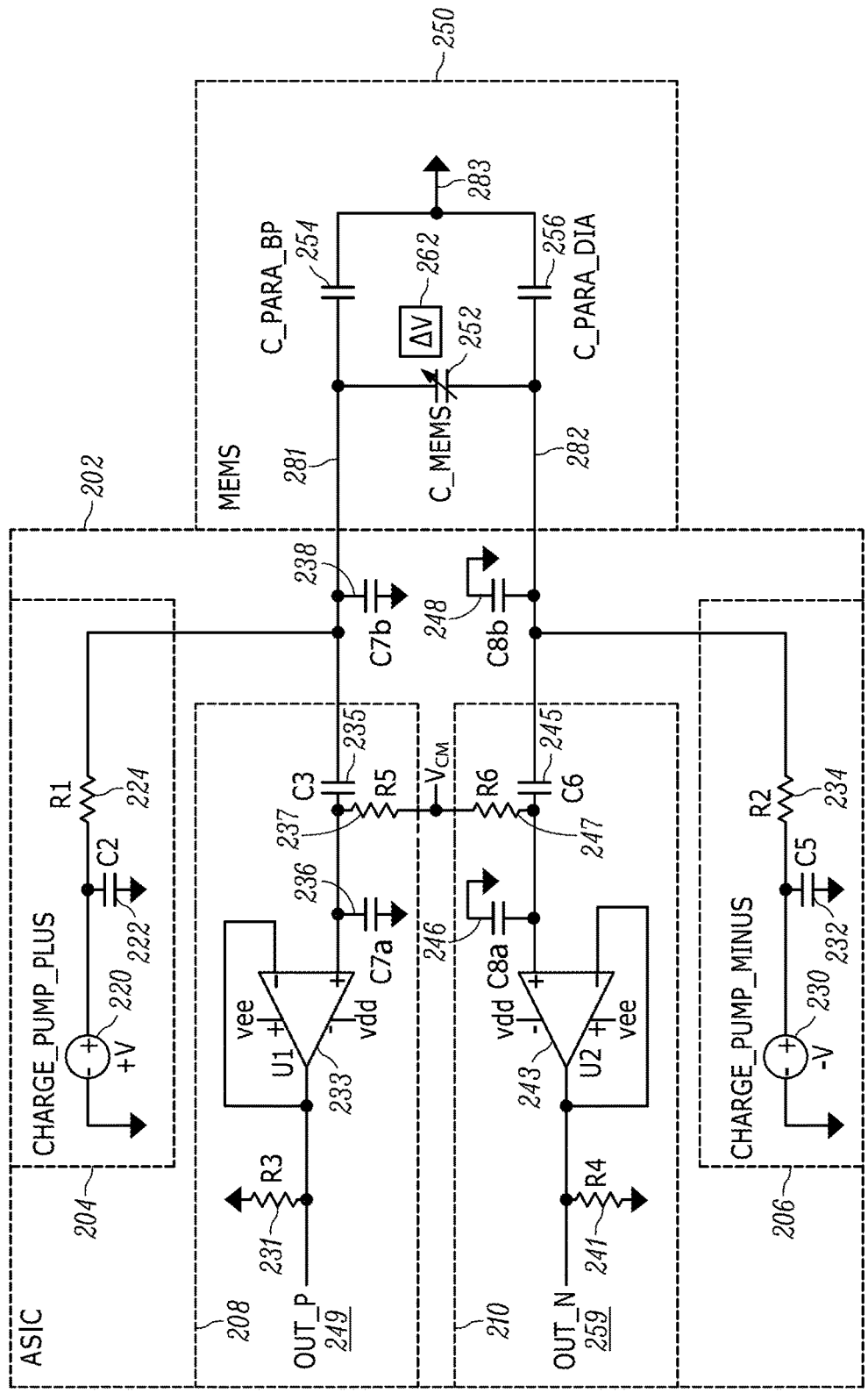
FIG. 3A is a circuit diagram of a MEMS microphone and an ASIC in accordance with various implementations.
Figure 4:
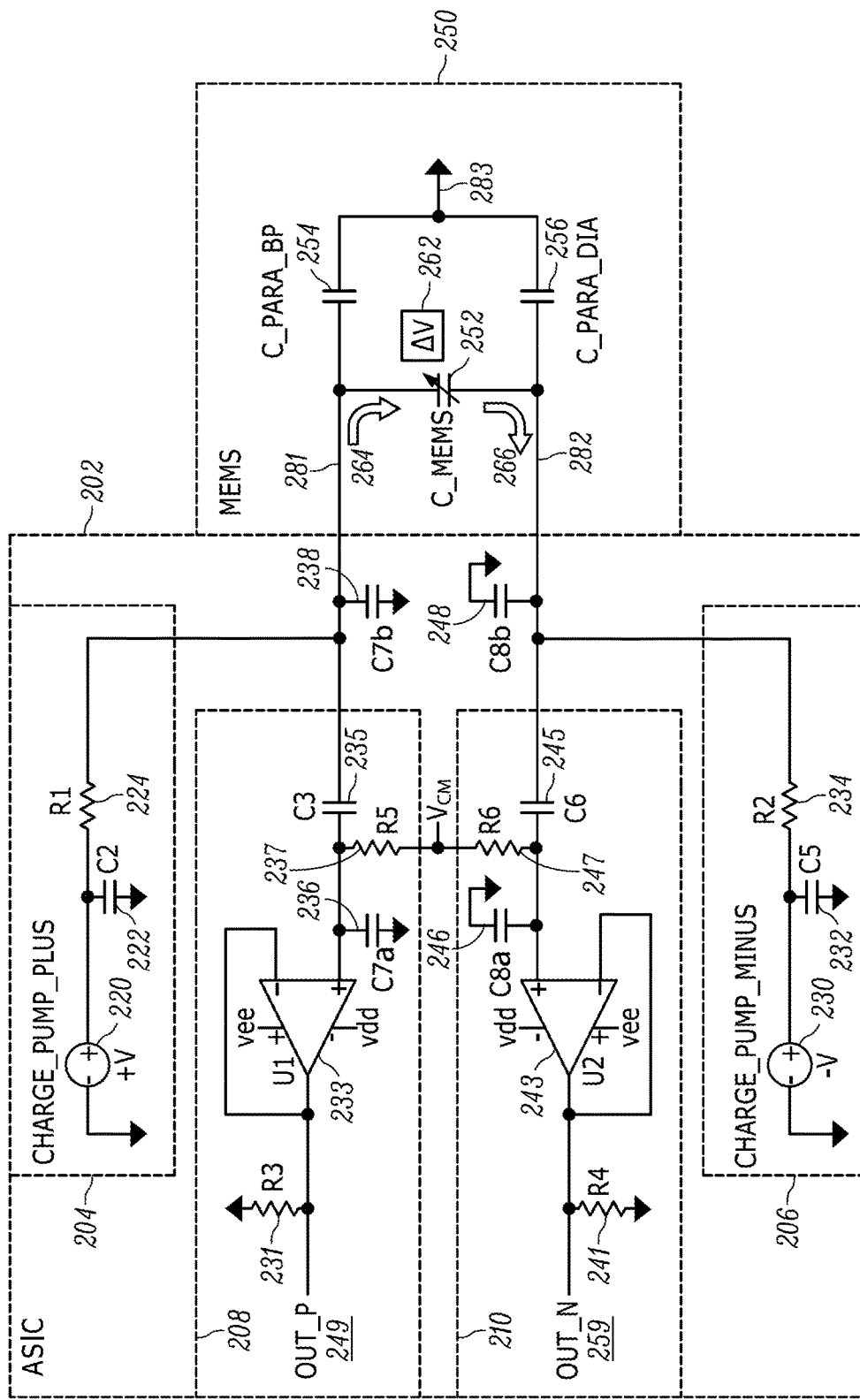
FIG. 4 is a circuit diagram of a MEMS microphone and an ASIC in accordance with various implementations.

As shown in FIGS. 3A and 4, sound pressure impacting and moving the diaphragm causes a change in voltage potential 262 and results in a current flow. The current flow includes a first current flow 264 moving into the MEMS transducer 250 and a second current flow 266 moving out of the MEMS transducer 250. It will be appreciated that the first current flow 264 and the second current flow 266 are in opposite directions from each other and this opposite direction of current flow creates a differential current signal. According to an exemplary embodiment, the first current flow 264 and the second current flow are 180 degrees (or approximately 180 degrees) out of phase with respect to each other and the magnitudes thereof are equal (or approximately equal).

Figure 5:
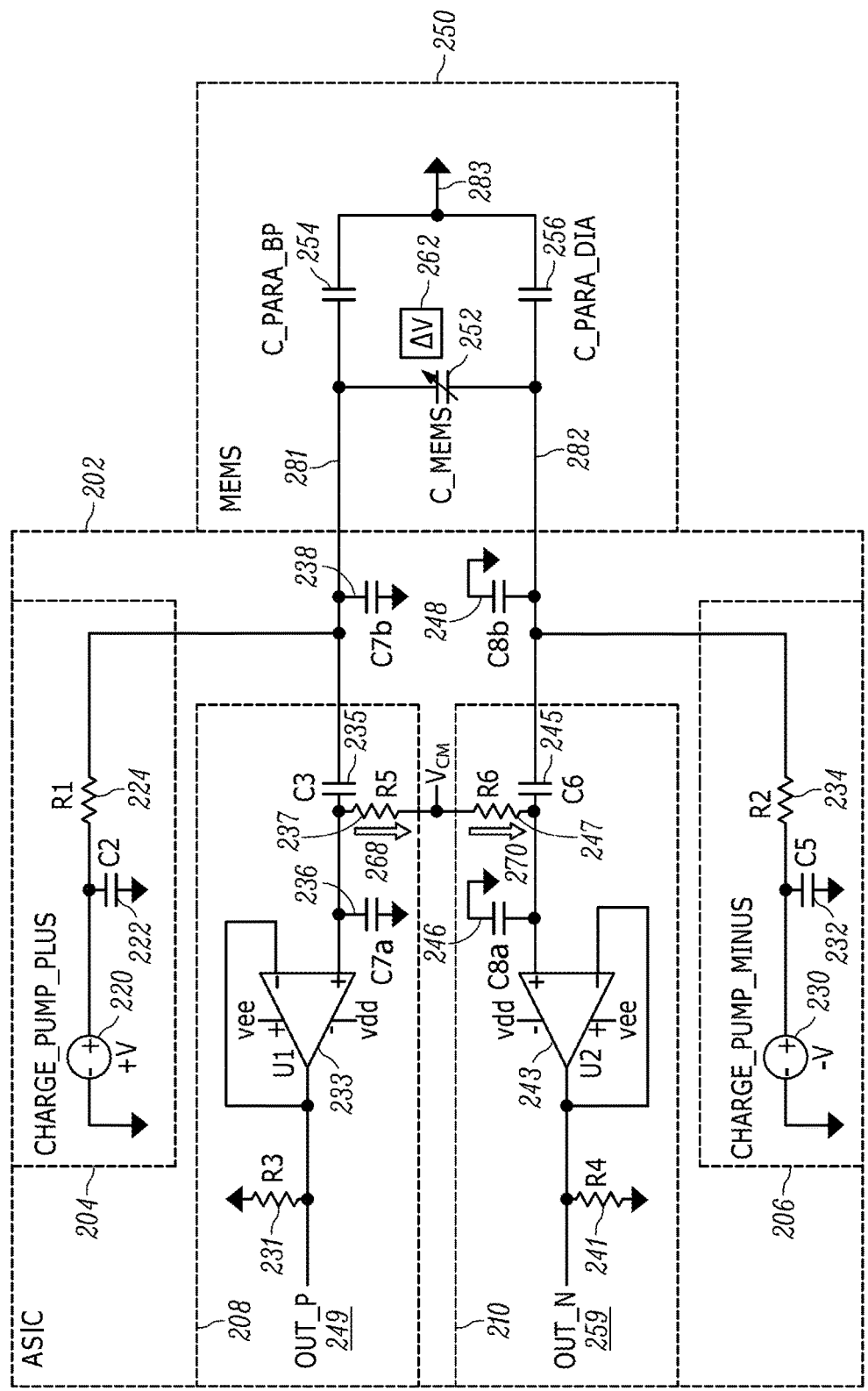
FIG. 5 is a circuit diagram of a MEMS microphone and an ASIC in accordance with various implementations.

According to the exemplary embodiment shown in FIG. 5, the changing current 264 flows through the first capacitor 235 of the first amplifier element 208 and is converted into a change in voltage 268 by the first impedance matching circuit (e.g., the first capacitor 235, the second capacitor 236, the third capacitor 238) of the first amplifier element 208. According to the exemplary embodiment shown in FIG. 5, the changing current 266 flows through the first capacitor 245 of the second amplifier element and is converted into a change in voltage 270 by the second impedance matching circuit (e.g., the first capacitor 245, the second capacitor 246, the third capacitor 248) of the second amplifier element 210.

According to an exemplary embodiment, the change in voltage 268 is fed to the first amplifier 233 and the change in voltage 270 is fed to the second amplifier 243. The first amplifier 233 is configured to produce a first output voltage signal 249 and the second amplifier 243 is configured to produce a second output voltage signal 259. According to an exemplary embodiment, the first output voltage signal (Out+) 249 and the second output voltage signal (Out−) 259 are differential signals. By "differential signals," it is meant two signals of equal (or approximately) magnitude, but phase shifted by 180 degrees (or approximately 180 degrees). Thus, the first and second amplifiers are representative of a differential amplifier. The amplifiers are drawn here in a unity gain configuration but any other type of amplifier structure which has a high impedance input may be used to amplify the signals.

A first capacitive load (e.g., from the second capacitor 236) exists at an input of the first amplifier 233 and a second capacitive load (e.g., from the second capacitor 246) exists at an input of the second amplifier 243. According to an exemplary embodiment, the second capacitor 236 and the second capacitor 246 are configured to adjust (e.g., alter, modulate) the first capacitive load and the second capacitive load, respectively, such that the first output voltage signal 249 and second output voltage signal 259 have similar amplitudes. The first capacitive load may be measured between the input of the first amplifier 233 and an AC ground. The second capacitive load may be measured between the input of the second amplifier 243 and an AC ground. Other measurement points may also be used to define the capacitive loads. Non-capacitive loads are also possible. According to an exemplary embodiment, the balanced loads in combination with the circuit configuration of the ASIC 202 (i.e., the integrated circuit 106) cause the MEMS transducer 250 (e.g., of the MEMS microphone 100) to output two differential currents that are converted to voltages, amplified, and output from the ASIC 202.

The first output voltage signal 249 and the second output voltage signal 259 may be subtracted from each other by a third amplifier or similar device (not shown in the figures). Thus, a single pressure change causes the MEMS transducer 250 to create the first output voltage signal 249 and the second output voltage signal 259. Each of the first output voltage signal 249 and the second output voltage signal 259 are matched or approximately matched in magnitude, and 180 degrees or approximately 180 degrees out of phase with respect to each other. The third amplifier may be located on the ASIC 202 or at a customer device (e.g., an electronic device deployed in a cellular phone, laptop, tablet, personal computer, smartwatch, etc.).

Figure 3B:
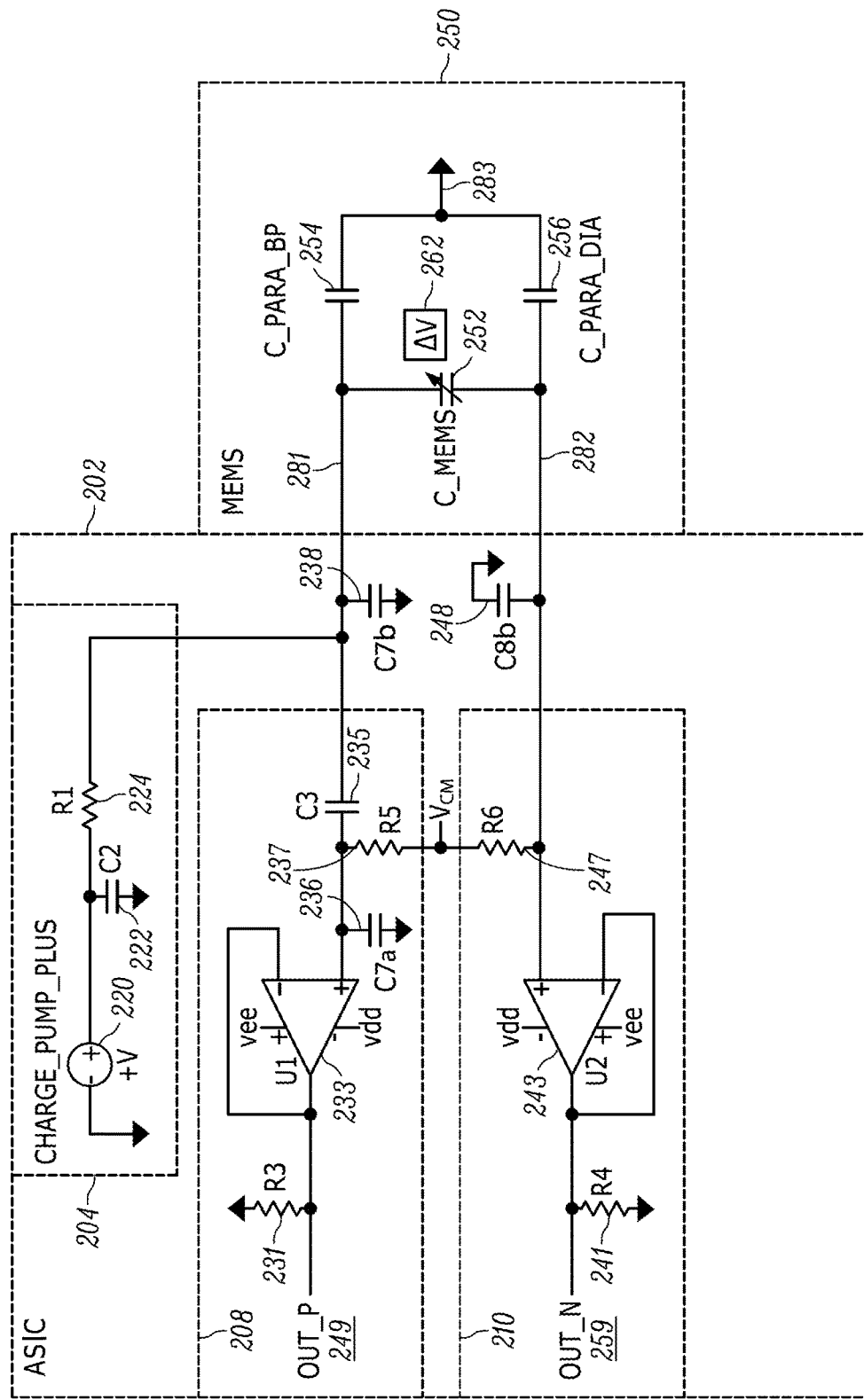
FIG. 3B is a circuit diagram of a MEMS microphone and an ASIC in accordance with various implementations.

According to the alternative embodiment shown in FIG. 3B, the ASIC 202 does not include the second charge pump 206 and the first capacitor 245 of the second amplifier element 210. The negative side of the MEMS device may have the same DC potential as the input of the second amplifier 243 and is defined by the second impedance element 247 of the second amplifier element 210. Alternatively, the ASIC 202 does not include the first charge pump 204 and/or the first capacitor 235 of the first amplifier element 208 (e.g., only the second charge pump 206 is included to bias the MEMS device).

Figure 6A:
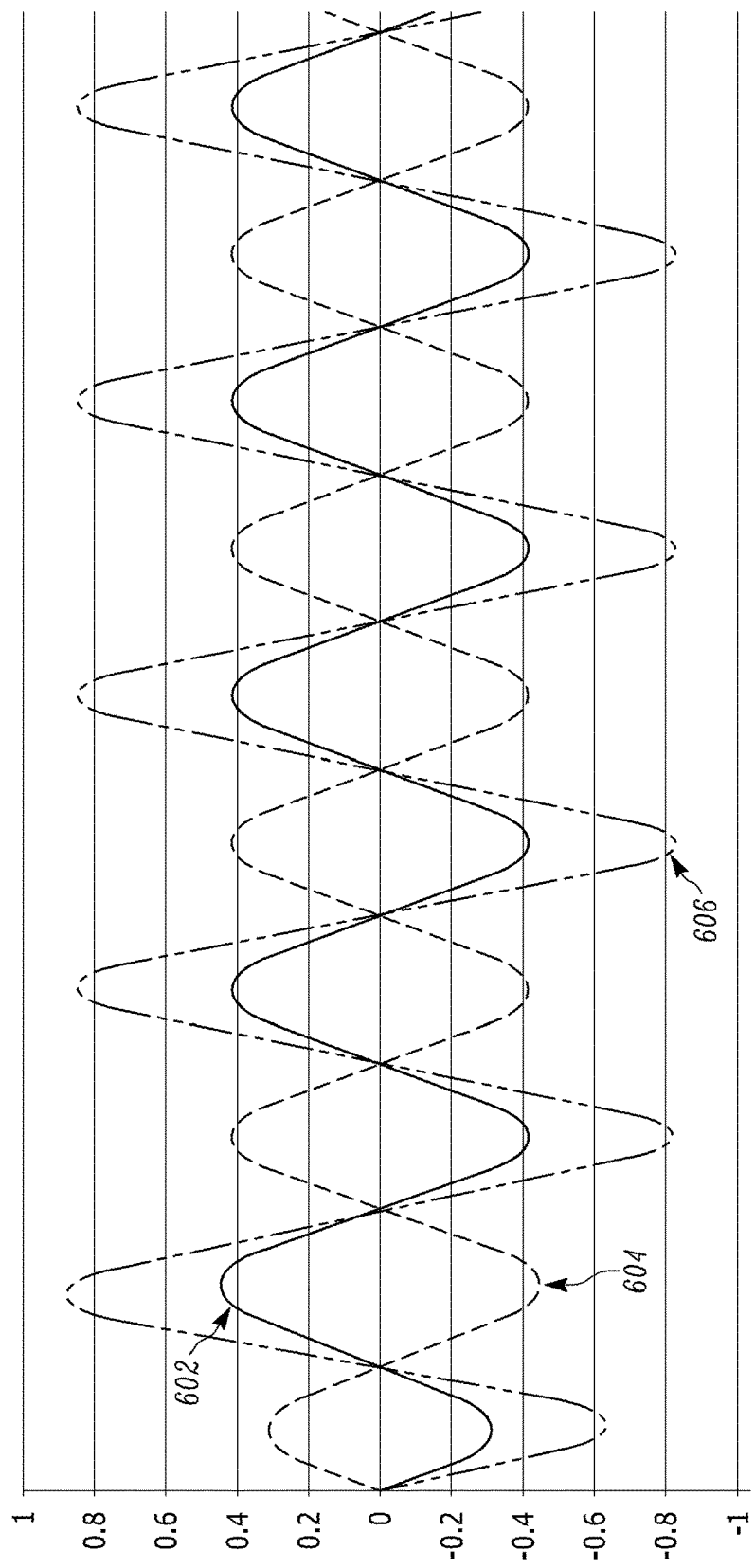
FIG. 6A is a graph in the time domain showing differential outputs achieved by the approaches described herein in accordance with various implementations.
Figure 6B:
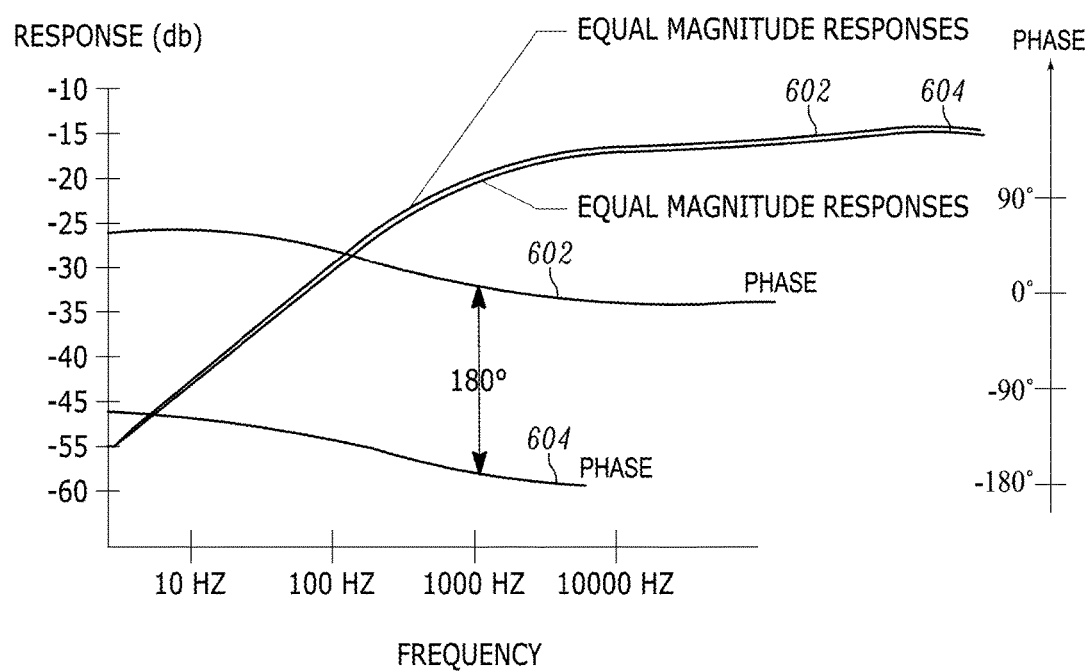
FIG. 6B shows the graph of FIG. 6A in the frequency domain and shows signals that are matched in magnitude, but phase shifted by 180 degrees (or approximately 180 degrees) in accordance with various implementations.

Referring now to FIG. 6A, one example of a graph showing differential outputs achieved by the approaches described herein is described. A first curve 602 represents the first output voltage signal 249 and a second curve 604 represents the second output voltage signal 259. A third curve 606 represents the result when the first output voltage signal 249 and the second output voltage signal 259 are subtracted (or summed) together by the third amplifier. As mentioned, the third amplifier may be either located on the ASIC 202 or at a different location such as a customer device. FIG. 6B shows the graph of FIG. 6A in the frequency domain, where it can be observed that the first curve 602 and the second curve 604 are matched in magnitude (as seen in the magnitude curves), but their phases are shifted 180 degrees (as seen in the corresponding phase curves).

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone assembly comprising:
   a capacitive MEMS transducer;
   a bias circuit having a DC output coupled to the transducer;
   a differential circuit having a first input coupled to a first output of the transducer and a second input coupled to a second output of the transducer;
   a first impedance matching network coupled to the first input of the differential circuit; and
   a second impedance matching network coupled to the second input of the differential circuit;
   wherein the first impedance matching network and the second impedance matching network are configured to balance a first capacitive load at the first input of the differential circuit and a second capacitive load at the second input of the differential circuit; and
   wherein electrical signals applied by the transducer to the first and second inputs of the differential circuit are matched or approximately matched in magnitude, and 180 degrees or approximately 180 degrees out of phase with respect to each other.

2. The assembly of claim 1, wherein the bias circuit includes a first charge pump coupled to the first output of the transducer and a second charge pump coupled to the second contact of the transducer.

3. The assembly of claim 1, wherein the bias circuit includes a charge pump coupled to the first output of the transducer.

4. The assembly of claim 1, wherein the first impedance matching network and the second impedance matching network include capacitors.

5. The assembly of claim 1, wherein the first capacitive load is measured between the first input of the differential circuit and an alternating current ground.

6. The assembly of claim 1, wherein the second capacitive load is measured between the second input of the differential circuit and an alternating current ground.

7. A microelectromechanical system (MEMS) microphone, comprising:
   a single MEMS transducer having a first contact and a second contact; and
   an integrated circuit including:
      a differential circuit having a first input coupled to the first contact of the MEMS transducer, the differential circuit having a second input coupled to the second contact of the MEMS transducer;
      a bias circuit having a bias signal output coupled to at least the first contact or the second contact of the MEMS transducer;
      a first impedance matching network coupled to the first input of the differential circuit, the bias signal output of the bias circuit, and the first contact of the MEMS transducer; and
      a second impedance matching network coupled to the second input of the differential circuit and the second contact of the MEMS transducer;
   wherein the first impedance matching network and the second impedance matching network are configured so that electrical signals applied by the MEMS transducer to the first input of the differential circuit and the second input of the differential circuit are matched or approximately matched in magnitude and 180 degrees or approximately 180 degrees out of phase with respect to each other.

8. The MEMS microphone of claim 7, wherein the bias circuit includes a charge pump having an output coupled to the first contact of the MEMS transducer.

9. The MEMS microphone of claim 7, wherein the differential circuit includes a first amplifier having the first input and a second amplifier having the having the second input.

10. The MEMS microphone of claim 7, wherein the MEMS transducer is a capacitive sensor and the first impedance matching network and the second impedance matching network include capacitors.

11. The MEMS microphone of claim 10, wherein the MEMS transducer includes a diaphragm and a back plate.

12. The MEMS microphone of claim 7, wherein the bias circuit includes a first charge pump having a first DC output coupled to the first contact of the MEMS transducer and a second charge pump having a second DC output coupled to the second contact of the MEMS transducer.

13. A microelectromechanical system (MEMS) transducer assembly comprising:
   a MEMS transducer having a first contact and a second contact; and
   an integrated circuit including:
      a bias circuit having a bias signal output coupled to the MEMS transducer;
      a differential circuit having a first input and a second input;

a first impedance matching network coupled to the first input and the first contact of the MEMS transducer;

a second impedance matching network coupled to the second input and the second contact of the MEMS transducer;

wherein the first impedance matching network and the second impedance matching network are configured such that output signals from the MEMS transducer applied to the first and second inputs of the differential circuit have substantially the same amplitude and are phase shifted by approximately 180 degrees.

14. The assembly of claim 13, wherein the MEMS transducer includes a back plate coupled to the first contact and a diaphragm coupled to the second contact, and wherein the bias signal output is coupled to either the first contact or the second contact of the MEMS transducer.

15. The assembly of claim 14, further comprising a housing formed by a substrate and a cover, the housing including a port between an interior of the housing and an exterior of the housing, wherein the MEMS transducer and the integrated circuit are disposed within the housing and wherein the MEMS transducer produces the output signal in response to sensing changes in acoustic pressure via the port.

16. The assembly of claim 15, wherein the first impedance matching network and the second impedance matching network balance impedances at the first and second inputs of the differential circuit.

17. The assembly of claim 13, wherein the bias signal output includes a DC bias signal output and wherein the first impedance matching network includes a blocking capacitor between the DC bias signal output and the first input.

18. The assembly of claim 13, wherein the bias circuit includes a first bias signal output coupled to the first contact of the MEMS transducer and a second bias signal output coupled to the second contact of the MEMS transducer.

* * * * *